(12) United States Patent
Pu et al.

(10) Patent No.: US 11,950,486 B2
(45) Date of Patent: Apr. 2, 2024

(54) DISPLAY DEVICE AND MANUFACTURING METHOD THEREOF, ELECTRONIC APPARATUS

(71) Applicant: BOE Technology Group Co., Ltd., Beijing (CN)

(72) Inventors: Chao Pu, Beijing (CN); Shengji Yang, Beijing (CN); Kuanta Huang, Beijing (CN); Pengcheng Lu, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 918 days.

(21) Appl. No.: 16/965,534

(22) PCT Filed: Aug. 27, 2019

(86) PCT No.: PCT/CN2019/102820
§ 371 (c)(1),
(2) Date: Jul. 28, 2020

(87) PCT Pub. No.: WO2021/035530
PCT Pub. Date: Mar. 4, 2021

(65) Prior Publication Data
US 2023/0180582 A1    Jun. 8, 2023

(51) Int. Cl.
*H10K 59/80*    (2023.01)
*H10K 59/12*    (2023.01)
*H10K 59/38*    (2023.01)

(52) U.S. Cl.
CPC ..... *H10K 59/8722* (2023.02); *H10K 59/1201* (2023.02); *H10K 59/38* (2023.02); *H10K 59/873* (2023.02)

(58) Field of Classification Search
CPC ................................................. H10K 59/8722
(Continued)

(56) References Cited

U.S. PATENT DOCUMENTS

| 2005/0014026 A1* | 1/2005 | Park | H10K 50/11 |
| | | | 428/917 |
| 2006/0087230 A1* | 4/2006 | Ghosh | H10K 50/846 |
| | | | 313/506 |

(Continued)

FOREIGN PATENT DOCUMENTS

| CN | 101447509 A | 6/2009 |
| CN | 103972414 A | 8/2014 |

(Continued)

OTHER PUBLICATIONS

Jul. 2, 20220 - (EP) Extended European Search Report Appn 19932268.6.

*Primary Examiner* — Igwe U Anya
(74) *Attorney, Agent, or Firm* — Banner & Witcoff, Ltd.

(57) ABSTRACT

A display device, an electronic apparatus and a method for manufacturing the display device are disclosed. The display device includes an array substrate and a first thin film encapsulation layer disposed on the array substrate. The array substrate is a silicon based organic light-emitting diode array substrate, and the array substrate includes a silicon substrate and a light-emitting device disposed on the silicon substrate; a second thin film encapsulation layer disposed between the light-emitting device and the first thin film encapsulation layer; and a color filter layer disposed between the first thin film encapsulation layer and the second thin film encapsulation layer, at each edge of the first thin film encapsulation layer, an orthographic projection of the array substrate on a plane parallel to the array substrate extends beyond an orthographic projection of the first thin film encapsulation layer on the plane.

17 Claims, 7 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2011/0101853 A1* | 5/2011 | Lee ........................ | H10K 50/84 445/24 |
| 2013/0049580 A1* | 2/2013 | Maindron .............. | H10K 71/00 313/512 |
| 2014/0042408 A1 | 2/2014 | Akagawa et al. | |
| 2015/0371573 A1 | 12/2015 | Choi et al. | |
| 2016/0172621 A1 | 6/2016 | Jiao et al. | |
| 2018/0061898 A1* | 3/2018 | Oh ........................ | G06F 3/0443 |
| 2018/0122875 A1* | 5/2018 | Bang .................. | H10K 59/1213 |
| 2018/0294317 A1 | 10/2018 | Wolk et al. | |
| 2018/0342693 A1 | 11/2018 | Sato | |
| 2020/0303672 A1* | 9/2020 | Wang ................. | H10K 50/8426 |

FOREIGN PATENT DOCUMENTS

| | | | |
|---|---|---|---|
| CN | 106104841 | A | 11/2016 |
| CN | 108933161 | A | 12/2018 |
| CN | 109802055 | A | 5/2019 |
| CN | 109841755 | A | 6/2019 |
| EP | 2838132 | A2 | 2/2015 |
| EP | 3293765 | A1 | 3/2018 |

* cited by examiner

DISPLAY DEVICE AND MANUFACTURING METHOD THEREOF, ELECTRONIC APPARATUS

This application is a U.S. National Phase Entry of International Application No. PCT/CN2019/102820 filed on Aug. 27, 2019, designating the United States of America. The present application claims priority to and the benefit of the above-identified application and the above-identified application is incorporated by reference herein in its entirety.

TECHNICAL FIELD

Embodiments of the present disclosure relate to a display device, an electronic apparatus and a method for manufacturing the display device.

BACKGROUND

A micro organic light-emitting diode (Micro-OLED) display device is a new type OLED display device that uses a silicon substrate as a base, and is also called a silicon-based organic light-emitting diode (silicon-based OLED) display device. Silicon-based OLED display devices have advantages of small size, high resolution and the like, and can be prepared by using mature CMOS integrated circuit processes, can implement active addressing of pixels, and can be prepared with functional circuits, including TCON (timing controller) circuit, over-current protection (OCP) circuit, etc., on a silicon-based substrate, thus achieving light weight design.

SUMMARY

At least one embodiment of the present disclosure provides a display device, comprising: an array substrate and a first thin film encapsulation layer disposed on the array substrate; the array substrate is a silicon based organic light-emitting diode array substrate, and the array substrate comprises: a silicon substrate and a light-emitting device disposed on the silicon substrate; a second thin film encapsulation layer disposed between the light-emitting device and the first thin film encapsulation layer; and a color filter layer disposed between the first thin film encapsulation layer and the second thin film encapsulation layer. At each edge of the first thin film encapsulation layer, an orthographic projection of the array substrate on a plane parallel to the array substrate extends beyond an orthographic projection of the first thin film encapsulation layer on the plane.

For example, the display device provided by at least one embodiment of the present disclosure further comprises a cover panel covering on the first thin film encapsulation layer, and at each edge of the first thin film encapsulation layer, an orthographic projection of the cover panel on the plane extends beyond the orthographic projection of the first thin film encapsulation layer on the plane.

For example, the display device provided by at least one embodiment of the present disclosure further comprises: a sealant disposed at sides of a periphery of the cover panel and connecting the cover panel with the array substrate.

For example, in the display device provided by at least one embodiment of the present disclosure, an adhesive height of the sealant at the sides of the periphery of the cover panel is larger than ½ of a thickness of a cover panel and less than the thickness of the cover panel.

For example, in the display device provided by at least one embodiment of the present disclosure, each edge of the first thin film encapsulation layer is spaced from the sealant by a predetermined distance.

For example, in the display device provided by at least one embodiment of the present disclosure, at each edge of the second thin film encapsulation layer, an orthographic projection of the first thin film encapsulation layer on the plane extends beyond an orthographic projection of the second thin film encapsulation layer on the plane.

For example, in the display device provided by at least one embodiment of the present disclosure, the first thin film encapsulation layer and the second thin film encapsulation layer are in contact with an upper surface of the silicon substrate, respectively.

For example, in the display device provided by at least one embodiment of the present disclosure, an edge of the first thin film encapsulation layer close to the light-emitting device is attached to a portion of an edge of the second thin film encapsulation layer away from the light-emitting device.

For example, in the display device provided by at least one embodiment of the present disclosure, the light-emitting device emits white light.

For example, in the display device provided by at least one embodiment of the present disclosure, the color filter layer includes a red-green-blue color filter layer.

For example, in the display device provided by at least one embodiment of the present disclosure, the second thin film encapsulation layer comprises: a first inorganic encapsulation layer located at a side of the light-emitting device away from the silicon substrate; a second inorganic encapsulation layer located at a side of the first inorganic encapsulation layer away from the silicon substrate; and a first organic encapsulation layer located at a side of the second inorganic encapsulation layer away from the silicon substrate. The first thin film encapsulation layer comprises: a second organic encapsulation layer located at a side of the color filter layer away from the silicon substrate; and a third inorganic encapsulation layer located at the side of the second inorganic encapsulation layer away from the silicon substrate, the first inorganic encapsulation layer has a refraction index larger than that of the second inorganic encapsulation layer, a refractive index of the second inorganic encapsulation layer, a refractive index of the first organic encapsulation layer and a refractive index of the second organic encapsulation layer are substantially same, and the second organic encapsulation layer has a refractive index larger than that of the third inorganic encapsulation layer.

For example, in the display device provided by at least one embodiment of the present disclosure, an absolute value of refractive index difference between the first inorganic encapsulation layer and the second inorganic encapsulation layer is larger than an absolute value of refractive index difference between the second organic encapsulation layer and the third inorganic encapsulation layer.

For example, in the display device provided by at least one embodiment of the present disclosure, the first inorganic encapsulation layer includes silicon nitride, the second inorganic encapsulation layer includes aluminum oxide, both the first organic encapsulation layer and the second organic encapsulation layer include at least one layer of parylene molecules, and the third inorganic encapsulation layer includes silicon oxide.

For example, in the display device provided by at least one embodiment of the present disclosure, a thickness of the first inorganic encapsulation layer in a direction perpendicular to a plane of the silicon substrate is larger than a thickness of the second inorganic encapsulation layer in the direction perpendicular to the plane of the silicon substrate, a thickness of the first organic encapsulation layer in the direction perpendicular to the plane of the silicon substrate is larger than a thickness of the first inorganic encapsulation layer in the direction perpendicular to the plane of the silicon substrate, the first organic encapsulation layer has a substantively same thickness as the second organic encapsulation layer in the direction perpendicular to the plane of the silicon substrate, a thickness of the second organic encapsulation layer in the direction perpendicular to the plane of the silicon substrate is larger than a thickness of the third inorganic encapsulation layer in the direction perpendicular to the plane of the silicon substrate, and a thickness of the third inorganic encapsulation layer in the direction perpendicular to the plane of the silicon substrate is larger than a thickness of the second inorganic encapsulation layer in the direction perpendicular to the plane of the silicon substrate and less than a thickness of the first inorganic encapsulation layer in the direction perpendicular to the plane of the silicon substrate.

At least one embodiment of the present disclosure provides a display device, comprising: an array substrate and a first thin film encapsulation layer disposed on the array substrate; the array substrate is a silicon based organic light-emitting diode array substrate, at each edge of the first thin film encapsulation layer, an orthographic projection of the array substrate on a plane parallel to the array substrate extends beyond an orthographic projection of the first thin film encapsulation layer on the plane.

At least one embodiment of the present disclosure provides an electronic apparatus comprising the display device of any one of the embodiments of the present disclosure, and the electronic apparatus is a virtual reality apparatus or an augmented reality apparatus.

At least one embodiment of the present disclosure provides a method for manufacturing a display device, comprising: forming an array substrate motherboard, wherein the array substrate motherboard is a silicon based organic light-emitting diode array substrate motherboard, and the array substrate motherboard comprises at least one array substrate region; forming a first thin film encapsulation layer in the array substrate region, wherein at each edge of the first thin film encapsulation layer, an orthographic projection of the array substrate on a plane parallel to the array substrate extends beyond an orthographic projection of the first thin film encapsulation layer on the plane; and cutting the array substrate motherboard after formation of the first thin film encapsulation layer so as to obtain an individual array substrate.

For example, in the method for manufacturing provided by the present disclosure, among edges of the first thin film encapsulation layer and edges of the array substrate region corresponding to each other and having unequal lengths, a distance of each edge of the first thin film encapsulation layer to a corresponding edge of the array substrate region is set to be larger than a sum of deposition alignment accuracy of the first thin film encapsulation layer and cutting alignment accuracy of the array substrate region.

For example, the method for manufacturing provided by the present disclosure, before cutting the array substrate motherboard after formation of the first thin film encapsulation layer so as to obtain an individual array substrate, further comprises: forming a cover panel on the first thin film encapsulation layer of the array substrate region; at each edge of the first thin film encapsulation layer, an orthographic projection of the cover panel on the plane extends beyond the orthographic projection of the first thin film encapsulation layer on the plane.

For example, in the method for manufacturing provided by the present disclosure, among edges of the first thin film encapsulation layer and edges of the cover panel, which correspond to each other and have unequal lengths, a distance of each edge of the first thin film encapsulation layer to a corresponding edge of the cover panel is set to be larger than a sum of deposition alignment accuracy of the first thin film encapsulation layer and adhesion alignment accuracy of the cover panel.

For example, the method for manufacturing provided by the present disclosure, further comprises: forming a sealant connecting the cover panel and the array substrate at sides of a periphery of the cover panel.

For example, the method for manufacturing provided by the present disclosure, further comprises: forming a light-emitting device on the array substrate region; forming a second thin film encapsulation layer between the light-emitting device and the first thin film encapsulation layer; and forming a color filter layer between the first thin film encapsulation layer and the second thin film encapsulation layer.

For example, in the method for manufacturing provided by the present disclosure, at each edge of the second thin film encapsulation layer, the orthographic projection of the first thin film encapsulation layer on the plane extends beyond an orthographic projection of the second thin film encapsulation layer within the plane.

For example, in the method for manufacturing provided by the present disclosure, among edges of the first thin film encapsulation layer and edges of the second thin film encapsulation layer corresponding to each other and having unequal lengths, a distance of each edge of the first thin film encapsulation layer to a corresponding edge of the second thin film encapsulation layer is set to be larger than a sum of the deposition alignment accuracy of the first thin film encapsulation layer and cutting alignment accuracy of the second thin film encapsulation layer.

For example, in the method for manufacturing provided by the present disclosure, an edge of the first thin film encapsulation layer close to the light-emitting device is formed on a portion of an edge of the second thin film encapsulation layer away from the light-emitting device.

BRIEF DESCRIPTION OF THE DRAWINGS

In order to more clearly explain the technical solutions of the embodiments of the present disclosure, the accompanying drawings of the embodiments will be briefly introduced below. Obviously, the accompanying drawings in the following description only relate to some embodiments of the present disclosure, rather than limit the present disclosure.

DETAILED DESCRIPTION

Figure 1A:
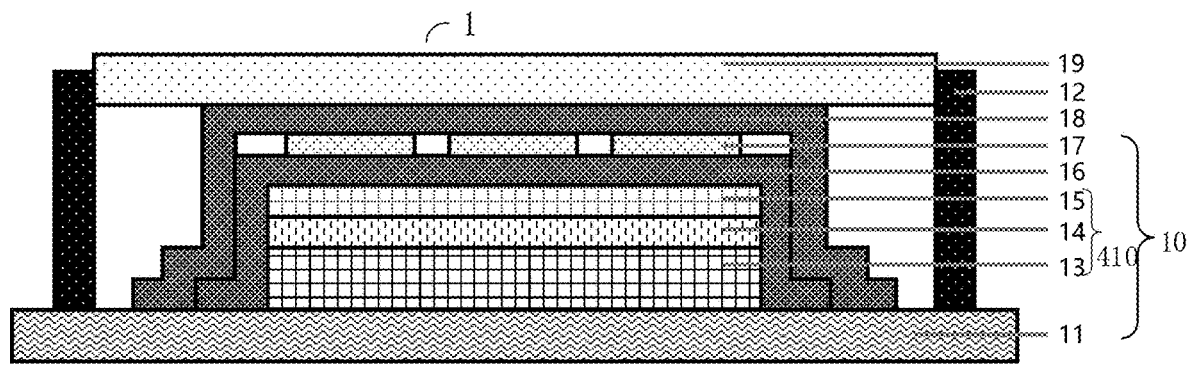
FIG. 1A is a schematic cross-sectional view of a display device provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, silicon-based OLED display devices have the advantages of small size, high resolution and the like, and are widely applied to a near-to-eye display field such as Virtual Reality (VR) or Augmented Reality (AR). A silicon-based OLED display device includes a silicon-based base substrate and an OLED light-emitting element array formed on the silicon-based base substrate, and isolates the OLED light-emitting element array from the outer environment by, for example, a thin film encapsulation, and also the silicon-based OLED display device usually further includes a cover panel glass for providing protective function. However, despite the use of encapsulation, invasion by water and oxygen in the outside atmosphere may still cause the organic light-emitting material of an OLED in the silicon-based OLED display device and electrodes prepared by an active metal to be suffered from erosion of water and oxygen, and thus incurs occurring of oxidation reactions, resulting that the pixels shrink or do not emit light, and the device has deteriorated performance, which ultimately affects the service life of the silicon-based OLED display device. Therefore, in the related technologies to the silicon-based OLED display device, an encapsulation technology for blocking water and oxygen is extremely important.

The inventors noted in the study that the reasons for the encapsulation failure problem of the silicon-based OLED display device mainly include two aspects: on one hand, when the panel is cut, the thin film encapsulation layer generates many cracks at edges of the thin film encapsulation layer upon the silicon-based base substrate being cut, and the water and oxygen in the outside atmosphere invade through the cracks in the thin film encapsulation layer to the OLED device; on the other hand, there is no a protective structure for blocking invasion of water and oxygen between a periphery of the glass cover panel and the silicon substrate, so the water and oxygen in the outside atmosphere easily access to the thin film encapsulation layer. In a large size OLED process, a method to alleviate this problem is to add a DAM structure along the circumference of the display region to extend the path of invasion of water and oxygen, but this method can only delay invasion of water and oxygen but cannot block invasion of water and oxygen, and due to a relatively small size of a silicon-based OLED, the effect of the DAM structure for delaying invasion of water and oxygen is extremely weak, therefore, it is impossible to indeed solve the problem that cracks at edges of the thin film encapsulation layer lead to failure of the encapsulation.

In view of the above problems, at least one embodiment of the present disclosure provides a display device including an array substrate and a first thin film encapsulation layer disposed on the array substrate; the array substrate is a silicon based organic light-emitting diode array substrate, and the array substrate includes a silicon substrate and a light-emitting device disposed on the silicon substrate, a second thin film encapsulation layer disposed between the light-emitting device and the first thin film encapsulation layer, and a color filter layer disposed between the first thin film encapsulation layer and the second thin film encapsulation layer. At each edge of the first thin film encapsulation layer, an orthographic projection of the array substrate on a plane parallel to the array substrate extends beyond an orthographic projection of the first thin film encapsulation layer on the plane.

Some embodiments of the present disclosure also provide an electronic apparatus corresponding to the aforementioned display device and a method for manufacturing the display device.

In the display device provided by the aforementioned embodiments of the present disclosure, because at each edge of the first thin film encapsulation layer, an orthographic projection of the array substrate on a plane parallel to the array substrate extends beyond an orthographic projection of the first thin film encapsulation layer on the plane, it can be avoided to cut the first thin film encapsulation layer when the panel is cut so as to avoid cracking of the first thin film encapsulation layer, so the invasion of water and oxygen in the outside atmosphere from cracks of the first thin film encapsulation layer to the OLED device in the display device can be avoided or significantly reduced without such cracks, enhancing the encapsulation technology for blocking the water and oxygen, and prolonging the service life of the display device.

Embodiments of the present disclosure and examples thereof are illustrated in details below with reference to the drawings.

At least one embodiment of the present disclosure provides a display device, for example, the display device is a silicon-based OLED display device, can be applied in a virtual reality apparatus or an augmented reality apparatus, of course the display device can also be another type of display device, and the embodiments of the present disclosure are not limited thereto.

Figure 2:
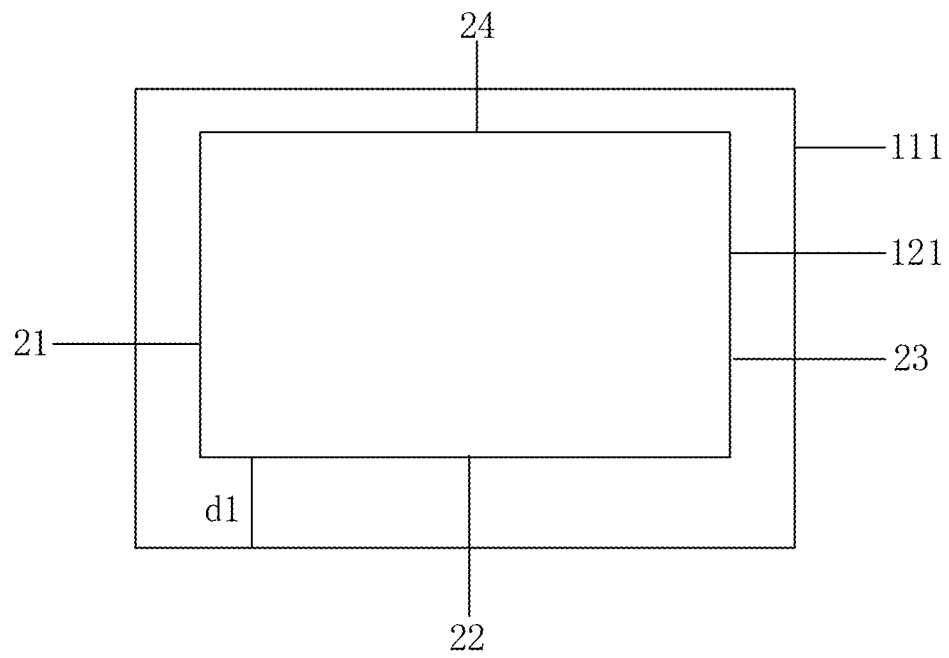
FIG. 2 is a schematic projection diagram of an example of the display device shown in FIG. 1A.

FIG. 1A is a schematic cross-sectional view of a display device provided by at least one embodiment of the present disclosure, FIG. 2 is a schematic projection diagram of the display device shown in FIG. 1A. The display device provided by at least one embodiment of the present disclosure is introduced in detail with reference to FIG. 1A and FIG. 2.

As shown in FIG. 1A, the display device 1 includes an array substrate 10 and a first thin film encapsulation layer 18 disposed on the array substrate 10.

For example, the array substrate 10 is a silicon-based array substrate, such as a silicon-based array substrate used for an organic light-emitting diode (OELD) display device (OLED silicon-based array substrate). The array substrate 10 for example includes a silicon substrate 11, and the silicon substrate may be a single crystal silicon substrate or a silicon-on-insulator (SOI) substrate. For example, the array substrate 10 can further include an organic light-emitting diode (OLED) device, a thin film encapsulation layer, a color filter layer, a light extraction layer and any suitable components that are disposed on the silicon substrate 11, so as to achieve the display function, and the detailed structure of the array substrate 10 will introduced in detail below and will not be repeated herein. For example, a gate drive circuit, a data drive circuit, a pixel circuit (not shown) and any suitable circuit components are integrated on the silicon substrate 11, and these circuit components are prepared by, for example, a silicon semiconductor process (e.g., CMOS process), and embodiments of the present disclosure are not limited thereto.

For example, as shown in FIG. 2, at each edge of the first thin film encapsulation layer 18 (the figure only shows the case that the first thin film encapsulation layer 18 includes four edges 21-24), an orthographic projection 111 of the array substrate on a plane parallel to the array substrate 10 extends beyond an orthographic projection 121 of the first thin film encapsulation layer 18 on the plane. That is, the region covered by the orthographic projection 111 of the array substrate 10 on the plane is larger than the region covered by the orthographic projection 121 of the first thin film encapsulation layer 18 on the plane, the orthographic projection 121 of the first thin film encapsulation layer 18 on the plane fully falls within the orthographic projection 111 of the array substrate 10 on the plane, i.e., the projection area of the first thin film encapsulation layer 18 on the plane is smaller than the projection area of the array substrate 10 on the plane, and each edge of the orthographic projection 121 of the first thin film encapsulation layer 18 on the plane has a certain distance d1 from the orthographic projection 111 of the array substrate on the plane. For example, the distances d1 between the edges may or may not be equal to each other, and embodiments of the present disclosure are not limited thereto.

For example, because the surface of the array substrate on which the light-emitting device is disposed is not necessarily of one plane, the side where a back side of the array substrate is located can serve as the plane parallel to the array substrate, in which case the following embodiments are the same and will not be repeated.

For example, in some examples, among the edges of the first thin film encapsulation layer 18 and the edges the array substrate 10, which correspond to each other in pair and have unequal lengths, the distance of each edge of the first thin film encapsulation layer 18 to the corresponding edge of the array substrate 10 is larger than the sum of deposition alignment accuracy (e.g., about 50 micrometers (μm)) of the first thin film encapsulation layer 18 and cutting alignment accuracy (e.g., about 100 μm) of the array substrate 10 (or scribe lines), so as to avoid that an orthographic projection of the array substrate region in a plane parallel to an array substrate motherboard extends beyond an orthographic projection of the first thin film encapsulation layer on the plane caused by coating alignment error and/or cutting alignment error, thus avoid cracking of the first thin film encapsulation layer in the course of the cutting, that is, it can be better guaranteed that the projection area of the first thin film encapsulation layer 18 on the plane is smaller than the projection area of the array substrate 10 on the plane with the aforementioned arrangement.

Here, the "orthographic projection" refers to a projection of the array substrate 10 within the plane parallel to the array substrate 10 along the direction perpendicular to the array substrate 10, or refers to a projection of the first thin film encapsulation layer 18 within the plane parallel to the array substrate 10 along the direction perpendicular to the array substrate 10.

By means of the aforementioned arrangement, when an original array substrate motherboard is cut to form individual array substrates, there is a certain distance spaced between the first thin film encapsulation layer 18 and a scribe line, the tool for cutting only contacts the array substrate 10 (e.g., contacts the region without being covered by the first thin film encapsulation layer at edges of the array substrate 10), rather than contacts the first thin film encapsulation layer 18, and so the cracking of the edges of the first thin film encapsulation layer 18, caused by that the edges of the first thin film encapsulation layer 18 is flushed with the edges of the array substrate 10, can be avoided, so that the invasion of water and oxygen in the outside atmosphere through the cracks to the OLED device can be avoided, and the service life of the display device is prolonged.

It should be noted that the shape of projection of the array substrate 10 on the plane is the same or substantially same as the shape of projection of the first thin film encapsulation layer 18 on the plane, and may be such as rectangle, square or hexagon. Of course, embodiments of the present disclosure are not limited thereto. For example, the shape of projection of the array substrate 10 on the plane can also be different from the shape of projection of the first thin film encapsulation layer 18 on the plane, and can be determined depending on actual needs. Here, the phrase such as "shapes are the same or substantially same" refers to both having the same type of shape, rather than refers to both having the same ratio among the corresponding edges. For example, when both shapes are rectangle, the length-width ratios thereof may or may not be the same, and embodiments of the present disclosure are not limited thereto For example, in some examples, as shown in FIG. 1A, the array substrate 10 includes a silicon substrate 11 and the light-emitting device 410, a second thin film encapsulation layer 16 and a color filter layer 17, which are disposed on the silicon substrate 11.

For example, the silicon substrate 11 functions for supporting and protection. The silicon substrate 11 includes a pixel circuit, a gate drive circuit, and a data drive circuit or the like, which are used for driving respective pixel units (the detailed structure of the silicon substrate 11 is not shown in FIG. 1A). The pixel circuit can be a conventional 2T1C pixel circuit or a 4T1C pixel circuit, can also be a pixel circuit having functions of internal compensation, external compensation or the like, and embodiments of the present disclosure are not limited thereto. For example, the gate drive circuit (not shown) is used to generate gate drive signals, the data drive circuit (not shown) is used to generate data signals, and both the gate drive circuit and the data drive circuit can employ the conventional circuit structure in the technical field, and embodiments of the present disclosure are not limited thereto. The pixel circuit, the gate drive circuit and the data drive circuit are prepared in the silicon substrate 11 by using CMOS processes.

For example, in some examples, as shown in FIG. 1A, the display device 1 further includes a cover panel 19 covering on the first thin film encapsulation layer 18. For example, the cover panel 19 is disposed opposite to the array substrate 10, and the cover panel 19 is for example attached on the first thin film encapsulation layer 19 to function for protection and enhancement of strength. For example, the cover panel 19 and the array substrate 10 are parallel to each other. For example, the material of the cover panel 19 is a transparent material, which, for example, can be an inorganic material such as glass or an organic material such as polyimide. For example, in some examples, the cover panel 19 can be made of a mother glass plate with high transmittance, and embodiments of the present disclosure do not define thereto.

At each edge of the first thin film encapsulation layer 18 (the figure only shows the case that the first thin film encapsulation layer 18 includes four edges 21-24), an orthographic projection of the cover panel 19 on the plane extends beyond an orthographic projection of the first thin film encapsulation layer 18 on the plane. That is, the region covered by the orthographic projection 112 of the cover panel 19 on the plane is larger than the region covered by the orthographic projection 121 of the first thin film encapsulation layer 18 on the plane, the orthographic projection 121 of the first thin film encapsulation layer 18 on the plane fully falls within the orthographic projection 112 of the cover panel 19 on the plane, i.e., the projection area of the first thin film encapsulation layer 18 on the plane is smaller than the projection area of the cover panel 19 on the plane, and each edge of the orthographic projection 121 of the first thin film encapsulation layer 18 on the plane has a certain distance d2 to the orthographic projection 112 of the cover panel 19 on the plane. For example, the distances d2 between the edges may or may not be equal to each other, and embodiments of the present disclosure are not limited thereto.

For example, in some examples, the orthographic projection of the array substrate on the plane extends beyond the orthographic projection of the cover panel on the plane, so that better alignment and sealing can be achieved, or breaking of the cover panel caused in the course of the cutting can be avoided.

For example, in some examples, the display device 1 further includes sealant 12 disposed on sides of a periphery of the cover panel 19 and connecting the cover panel 19 with the array substrate 10. The sides of the periphery of the cover panel 19 and the array substrate 10 are sealed with sealant 12; for example, an adhesive height of the sealant 12 at the sides of the periphery of the cover panel 19 is larger than ½ of the thickness of the cover panel 19 and less than the thickness of the cover panel, that is, the distance of an upper edge of the sealant 12 from an upper surface of the cover panel 19 is smaller than ½ of the thickness of the cover panel 19, and so it is able to ensure the sealing effect and increasing of the thickness of the display device caused by the sealant exceeding the upper surface of the cover panel 19 can be prevented. In this case, the sides of the periphery of the cover panel 19 and the silicon-based base substrate are sealed with sealant 12 therebetween, and further protection is provided for blocking invasion of water and oxygen, and in turn the service life of the silicon-based OLED display device considerably increases.

For example, in some examples, as shown in FIG. 1A, each edge of the first thin film encapsulation layer 18 and the sealant 12 can be spaced by a predetermined distance, which therefore further prolongs the path of invasion of water and oxygen.

For example, the predetermined distance is larger than the sum of deposition alignment accuracy (e.g., about 50 μm) of the first thin film encapsulation layer 18 and cutting alignment accuracy (e.g., about 100 μm)) of the cover panel 19.

For example, in some examples, among edges of the first thin film encapsulation layer 18 and edges of the cover panel 19, which correspond to each other and have unequal lengths, the distance of each edge of the first thin film encapsulation layer 18 to a corresponding edge of the cover panel 19 is larger than the sum of deposition alignment accuracy (e.g., about 50 μm) of the first thin film encapsulation layer 18 and adhesion alignment accuracy (e.g., about 100 μm) of the cover panel 19, so as to avoid that an orthographic projection of the cover panel in the plane does not extend beyond an orthographic projection of the first thin film encapsulation layer on the plane caused by deposition alignment accuracy and/or cutting alignment accuracy, which causes that sealant does not function sealing, such arrangement can better guarantee that the projection of the array substrate on the plane fully extends beyond the projection of the cover panel on the plane, thereby providing further protection against invasion of water and oxygen.

For example, the light-emitting device 410 includes a first electrode 13, an organic light-emitting layer 14 and a second electrode 15. For example, the first electrode 13 of the light-emitting device 410 is formed on the silicon substrate 11, the organic light-emitting layer 14 is formed on the first electrode 13 of the light-emitting device, and the second electrode 15 is formed on the organic light-emitting layer 14.

For example, the first electrode 13 of the light-emitting device is anode, the second electrode 15 of the light-emitting device is cathode, for example, is grounded. For example, the first electrode 13 of the light-emitting device can made of a transparent metal oxide material including indium tin oxide (ITO), indium zinc oxide (IZO) or the like, which has relatively high light transmittance. For example, the second electrode 15 of the light-emitting device has a material of metal, for example, metal can be made of magnesium, magnesium alloy, aluminum or aluminum alloy or other materials.

For example, the organic light-emitting layer 14 can be a single-layer or multi-layer structure. For example, in some examples, the organic light-emitting layer 14 can include a light-emitting layer and a multi-layer structure including one or more film layers including a hole injection layer, an electron injection layer, a hole transport layer, an electron transport layer, an electron blocking layer, and a hole blocking layer. For example, the organic light-emitting layer 14 can be made of an organic material, and emits light according to a required gray scale by utilizing the light-emitting characteristic, under the driving by the voltage across the first electrode 13 and the second electrode 15.

For example, the light-emitting device is an OLED light-emitting device. For example, the light-emitting device emits white light. For example, the light-emitting device can emit white light through a white light-emitting device, for example, white light can be emitted by a light-emitting layer combination including a plurality of light-emitting layers. For example, the light-emitting layer combination includes three light-emitting layers that respectively emit red, green and blue light, and the three light-emitting layers are stacked in sequence with respect to the silicon substrate 11 to emit white light as a whole, or else the light-emitting layer combination includes a light-emitting layer that emits one color and a light-emitting layer that emits light of a complementary color to the color, and these two light-emitting layers are stacked in sequence with respect to the silicon substrate 11 for emitting white light as a whole; these two light-emitting layers include a light-emitting layer that emits red light and a light-emitting layer that emits light of a complementary color to red, and embodiments of the present disclosure are not limited thereto, as long as white light can be achieved.

For example, the second thin film encapsulation layer 16 is disposed between the light-emitting device 410 and the first thin film encapsulation layer 18; the color filter layer 17 is disposed between the first thin film encapsulation layer 18 and the second thin film encapsulation layer 16.

For example, at each edge of the second thin film encapsulation layer 16, an orthographic projection of the first thin film encapsulation layer 18 on the plane extends beyond an orthographic projection of the second thin film encapsulation layer 16 on the plane.

At each edge of the second thin film encapsulation layer 16 (the figure only shows the case that the second thin film encapsulation layer 16 includes four edges 25-28), an orthographic projection of the first thin film encapsulation layer 18 on the plane extends beyond an orthographic projection of the second thin film encapsulation layer 16 on the plane. That is, the region covered by the orthographic projection 121 of the first thin film encapsulation layer 18 on the plane is larger than the region covered by the orthographic projection 122 of the second thin film encapsulation layer 16 on the plane, the orthographic projection 121 of the first thin film encapsulation layer 16 on the plane fully falls within the orthographic projection 122 of the first thin film encapsulation layer 18 on the plane, i.e., the projection area of the second thin film encapsulation layer 16 on the plane is smaller than the projection area of the first thin film encapsulation layer 18 on the plane, and each edge of the orthographic projection 121 of the second thin film encapsulation layer 16 on the plane has a certain distance d3 from the orthographic projection 112 of the first thin film encapsulation layer 18 on the plane. For example, the distances d3 between the edges may or may not be equal to each other, and embodiments of the present disclosure are not limited thereto.

For example, in some examples, among edges of the first thin film encapsulation layer 18 and edges of the second thin film encapsulation layer 16, which correspond to each other and have unequal lengths, the distance of each edge of the first thin film encapsulation layer 18 to a corresponding edge of the second thin film encapsulation layer 16 is larger than the sum of deposition alignment accuracy (e.g., about 50 µm) of the first thin film encapsulation layer 18 and deposition alignment accuracy (e.g., about 50 µm) of the second thin film encapsulation layer 16.

For example, in some examples, as shown in 1A, an edge of the first thin film encapsulation layer 18 close to the light-emitting device 410 is attached to a portion of an edge of the second thin film encapsulation layer 16 away from the light-emitting device 410. For example, the edge of the first thin film encapsulation layer 18 close to the light-emitting device 410 is attached to a side edge of the second thin film encapsulation layer 16 away from the light-emitting device 410 to enhance the sealing effect.

For example, the first thin film encapsulation layer 18 and the second thin film encapsulation layer 16 are respectively in contact with the upper surface of the silicon substrate 11 to form a sealed structure, that is, forming double effective encapsulation for the light-emitting device 410, i.e., two-layer encapsulation of the first thin film encapsulation layer and the second thin film encapsulation layer, which achieves more effective blocking of water vapor, oxygen or the like for the purpose of protection for the light-emitting device 410 and extension of the service life of the light-emitting device 410.

For example, the color filter layer 17 includes RGB color filter units and matches with the organic light-emitting layer 14 respectively, and the color filter layer 17 is disposed above the second thin film encapsulation layer 16 and corresponding to the organic light-emitting layer 14, so that a color display can be achieved by the emitted light. Of course, embodiments of the present disclosure are not limited thereto, the color filter layer 17 may also include pixel regions of other colors, such as white, yellow or the like.

Figure 1B:
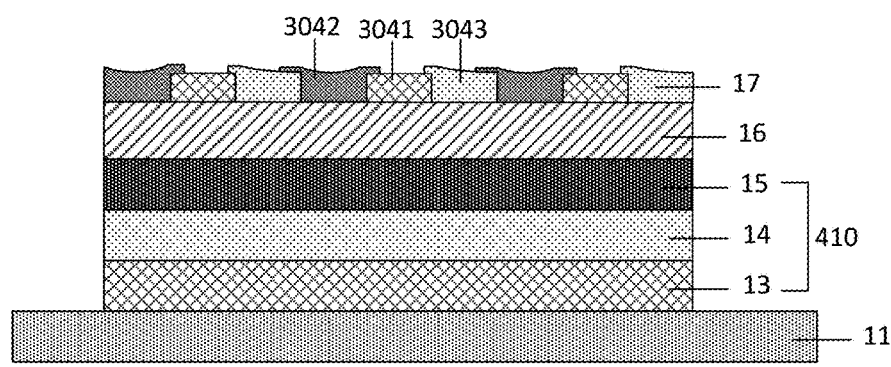
FIG. 1B is a schematic cross-sectional view of another display device provided by at least one embodiment of the present disclosure.

For example, as shown in FIG. 1B, the color filter layer 17 include a first color filter layer 3041 (e.g., a green color filter unit G), a second color filter layer 3042 (e.g., a red color filter unit R) partially covering on a side surface of the first color filter layer 3041, and a third color filter layer 3043 (e.g., a blue color filter unit B) partially covering on the other side surface of the first color filter layer 3041. In the two adjacent pixel units, the second color filter layer 3042 (e.g., a red color filter unit R) in one pixel unit partially covers the third color filter layer 3043 (e.g., a blue color filter unit B) in the other pixel unit adjacent to the one pixel unit. The third color filter layer 3043 (e.g., a blue color filter unit B) has adhesion larger than that of the second color filter layer 3042 (e.g., a red color filter unit R) and less than that of the first color filter layer 3041 (e.g., a green color filter unit G).

For example, the second color filter layer 3042 with small adhesion partially covers on the first color filter layer 3041 with large adhesion, which can reduce the contact area between the second color filter layer 3042 with small adhesion and the cathode 3023 of the light-emitting element. The base material of the first color filter layer 3041 and the base material of the second color filter layer 3042 are substantially the same, and the adhesion between the first color filter layer 3041 and the second color filter layer 3042 is greater than the adhesion between the second color filter layer 3042 and the cathode 3023 of the light-emitting element 302. Compared with the case where the second color filter layer 3042 does not cover the first color filter layer 3041 at all, the second color filter layer 3042 partially covering the first color filter layer 3041 can reduce the possibility of peeling of the first color filter layer 3041 and the second color filter layer 3042 as a whole from the cathode 3023 of the light-emitting element 302. In addition, because the second color filter layer 3402 has small adhesion and good fluidity, in the course of forming the second color filter layer 3042, the content of surface air bubbles of the first color filter layer 3041 and the second color filter layer 3042 as a whole away from the light-emitting element 302 can be reduced, so that the uniformity of film thickness of the entirety of the first color filter layer 3041 and the second color filter layer 3042 at the location where they overlap can be increased.

For example, as shown in FIG. 1A, the first thin film encapsulation layer 18 and the cover panel 19 are disposed in sequence above the color filter layer 17, so that the function for protecting the color filter layer 17 can be achieved. For example, the first thin film encapsulation layer 18 and the second thin film encapsulation layer 16 are made of a combination of one or more of organic materials or inorganic materials with good sealing characteristics to make a good sealing effect and protect the light-emitting device 410. For example, any one of the first thin film encapsulation layer 18 and the second thin film encapsulation layer 16 can be a composite film layer including one or more organic sub-film layers or inorganic sub-film layers.

Figure 1C:
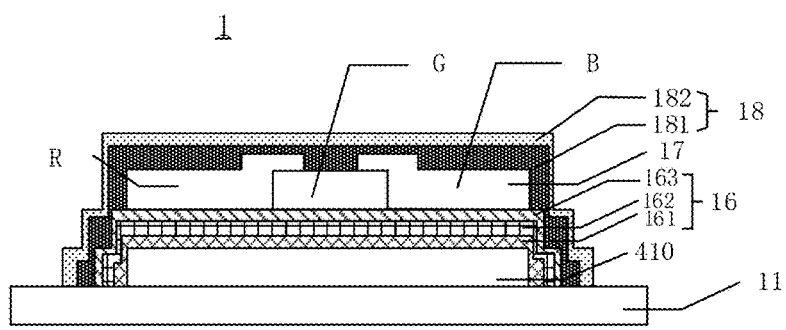
FIG. 1C is a schematic cross-sectional view of yet another display device provided by at least one embodiment of the present disclosure.

For example, as shown in FIG. 1C, in some examples, the second thin film encapsulation layer 16 includes: a first inorganic encapsulation layer 161 at the side of the light-emitting device 410 away from the silicon substrate 11; a second inorganic encapsulation layer 162 at the side of the first inorganic encapsulation layer 161 away from the silicon substrate 11; and a first organic encapsulation layer 163 at the side of the second inorganic encapsulation layer 162 away from the silicon substrate 11. For example, the first thin film encapsulation layer 18 includes: a second organic encapsulation layer 181 at the side of the color filter layer 17 away from the silicon substrate 11; and a third inorganic encapsulation layer 182 at a the side of the second organic encapsulation layer 181 away from the silicon substrate 11. The first inorganic encapsulation layer 161 has a refraction index larger than that of the second inorganic encapsulation layer, the refractive index of the second inorganic encapsulation layer 162, the refractive index of the second inorganic encapsulation layer 162, a refractive index of the first organic encapsulation layer 163, and a refractive index of the second organic encapsulation layer 181 are substantially the same, and the second organic encapsulation layer 181 has a refractive index larger than that of the third inorganic encapsulation layer 182.

The first inorganic encapsulation layer 161 has a refraction index larger than that of the second inorganic encapsulation layer, the refractive index of the second inorganic encapsulation layer 162, the refractive index of the first organic encapsulation layer 163 and the refractive index of the second organic encapsulation layer 181 are substantially same, and the second organic encapsulation layer 181 has a refractive index larger than that of the third inorganic encapsulation layer 182.

For example, the absolute value of the refractive index difference between the first inorganic encapsulation layer 161 and the second inorganic encapsulation layer 162 is larger than the absolute value of the refractive index difference between the second organic encapsulation layer 181 and the third inorganic encapsulation layer 182. For example, the first inorganic encapsulation layer 161 can be formed of silicon nitride (SiNx) with a refractive index of approximately 1.85, the second inorganic encapsulation layer 162 can be formed of aluminum oxide with a refractive index of approximately 1.6, and both the first organic encapsulation layer 163 and the second organic encapsulation layer 181 can be formed of parylene with a refractive index of approximately 1.6, and the third inorganic encapsulation layer 182 can be formed of silicon oxide with a refractive index of approximately 1.5. Therefore, the absolute value of the refractive index difference between the first inorganic encapsulation layer 161 and the second inorganic encapsulation layer 162 or the first organic encapsulation layer 163 is 0.25, which is larger than the absolute value of refractive index difference between the second organic encapsulation layer 181 and the third inorganic encapsulation layer 182, which is 0.1.

For example, the first inorganic encapsulation layer 161 can include silicon nitride, the second inorganic encapsulation layer 162 can include aluminum oxide, both the first organic encapsulation layer 163 and the second organic encapsulation layer 181 include at least one layer of parylene molecules, and the third inorganic encapsulation layer 182 includes silicon oxide, however, it should be understood that embodiments of the present disclosure are not limited thereto.

For example, the thickness of the first inorganic encapsulation layer 161 in a direction perpendicular to a plane of the silicon substrate 11 may be larger than the thickness of the second inorganic encapsulation layer 162 in the direction perpendicular to the plane of the silicon substrate 11. For example, the thickness of the first organic encapsulation layer 163 in the direction perpendicular to the plane of the silicon substrate 11 is larger than the thickness of the first inorganic encapsulation layer 161 in the direction perpendicular to the plane of the silicon substrate 11. The first organic encapsulation layer 163 has a substantially same thickness as the second organic encapsulation layer in the direction perpendicular to the plane of the silicon substrate, the thickness of the second organic encapsulation layer 181 in the direction perpendicular to the plane of the silicon substrate 11 is larger than the thickness of the third inorganic encapsulation layer 182 in the direction perpendicular to the plane of the silicon substrate 11. The thickness of the third inorganic encapsulation layer 182 in the direction perpendicular to the plane of the silicon substrate is larger than the thickness of the second inorganic encapsulation layer 162 in the direction perpendicular to the plane of the silicon substrate 11 and less than the thickness of the first inorganic encapsulation layer 161 in the direction perpendicular to the plane of the silicon substrate 11.

In some examples, the first inorganic encapsulation layer 161 can be formed of silicon nitride (SiNx) with a refractive index of about 1.85 to have a thickness of about 2500 angstroms (Å) to 3500 angstroms (Å) in the direction perpendicular to the plane of the silicon substrate 11; the second inorganic encapsulation layer 162 can be formed of aluminum oxide with a refractive index of about 1.6 to have a thickness of about 100 angstroms (Å) to 800 angstroms (Å) in the direction perpendicular to the plane of the silicon substrate 11; both the first organic encapsulation layer 163 and the second organic encapsulation layer 181 can be formed of parylene with a refractive index of 1.6 to have a thickness of about 4000 angstroms (Å) to 8000 angstroms (Å) in the direction perpendicular to the plane of the silicon substrate 11, and the third inorganic encapsulation layer 182 can be formed of silicon oxide with a refractive index of 1.5 to have a thickness of about 900 angstroms (Å) to 1500 angstroms (Å) in the direction perpendicular to the plane of the silicon substrate 11. For example, the first inorganic encapsulation layer 161 can be formed of silicon nitride (SiNx) with a refractive index of about 1.85 to have a thickness of about 3000 angstroms (Å) in the direction perpendicular to the plane of the silicon substrate 11; the second inorganic encapsulation layer 162 can be formed of aluminum oxide with a refractive index of about 1.6 to have a thickness of about 500 angstroms (Å) in the direction perpendicular to the plane of the silicon substrate 11; both the first organic encapsulation layer 163 and the second organic encapsulation layer 181 can be formed of parylene with a refractive index of 1.6 to have a thickness of about 5000 angstroms (Å) in a direction perpendicular to the plane of the silicon substrate 11, and the third inorganic encapsulation layer 182 can be formed of silicon oxide with a refractive index of 1.5 to have a thickness of about 1000 angstroms (Å) in the direction perpendicular to the plane of the silicon substrate 11.

The second organic encapsulation layer 181 can be formed by a polymer material, which may be, for example, one of followings: parylene, acrylic-based resin, methacrylic-based resin, polyisoprene, vinyl resin, epoxy resin, urethane resin, cellulose-based resin, perylene resin or the like. The thickness of the second organic encapsulation layer 181 can be precisely controlled by employing a molecular layer deposition (MLD) method, and the second organic encapsulation layer 181 can include at least one layer of polymer molecules, and the polymer is any one of the above polymer. For example, when the first organic encapsulation layer 163 is formed of parylene, the second organic encapsulation layer 181 may include a single layer of parylene molecules, two layers of parylene molecules, three layers of parylene molecules, five layers of parylene molecules, ten layers of parylene molecules, or the like. It should be understood that the polymer molecules forming the second organic encapsulation layer 181 may or may not be the same as the polymer molecules forming the first organic encapsulation layer 163, and embodiments of the present disclosure are not limited thereto. For example, the first organic encapsulation layer 163 formed of parylene molecules can have a thickness of 100 angstroms (Å), 500 angstroms (Å), 1000 angstroms (Å), 5000 angstroms (Å), or the like.

The thickness of the second organic encapsulation layer 181 can be precisely controlled by the MLD method to achieve controlling for an angstrom (A)-level thickness, so that the thickness of encapsulation layers and also the device total thickness of the display device 1 are reduced, and the visual angle of the display device 1 is increased, compared with other methods such as inkjet printing, which usually forms a thick film layer of a few microns.

The third inorganic encapsulation layer 182 can be formed of an inorganic material, and the inorganic material may be at least one of aluminum nitride, silicon nitride (SiNx), silicon oxynitride, silicon oxide, aluminum oxide, diamond-like carbon, or the like. The third inorganic encapsulation layer 182 may be formed on a side of the second organic encapsulation layer 181 away from the color filter layer 107 by a method such as chemical vapor deposition (CVD) (e.g., plasma enhanced chemical vapor deposition (PECVD)), ion plating, atomic layer deposition (ALD), or the like. The third inorganic encapsulation layer 182 can have a better effect of preventing penetration of oxygen and moisture than the second organic encapsulation layer 181. It should be understood that the polymer molecules forming the third organic encapsulation layer 182 may or may not be the same as the polymer molecules forming the first sub encapsulation layer 103, and embodiments of the present disclosure are not limited thereto. For example, the third inorganic encapsulation layer 182 may be formed of silicon oxide, and may have a thickness of 1000 angstroms (Å).

In some embodiments, the refractive index of the second organic encapsulation layer 181 can be larger than the refractive index of the third inorganic encapsulation layer 182. For example, the second organic encapsulation layer 181 be formed of parylene with a refractive index of 1.6, and the third inorganic encapsulation layer 182 may be formed of silicon oxide with a refractive index of 1.5.

The color filter layer 17 can include red sub color filter units R, green sub color filter units G, and blue sub color filter units B, which may be arranged in an array, however, it should be understood that embodiments of the present disclosure are not limited thereto. For example, the color filter layer 17 is sandwiched between the first thin film encapsulation layer 18 and the second thin film encapsulation layer 16 to release stresses of the first thin film encapsulation layer 18 and the second thin film encapsulation layer 16.

In some embodiments, it is possible to make the refractive index of the second thin film encapsulation layer 16 greater than the refractive index of the first thin film encapsulation layer 18, so that the difference between the refractive index of the first thin film encapsulation layer 18 close to air and the refractive index of air is relatively small, thereby increasing a light extracting ratio. In an exemplary embodiment, the absolute value of the refractive index difference between the first inorganic encapsulation layer 161 and the first organic encapsulation layer 163 is larger than the absolute value of the refractive index difference between the second organic encapsulation layer 181 and the third inorganic encapsulation layer 182. For example, the first inorganic encapsulation layer 161 can be formed of silicon nitride (SiNx) with a refractive index of 1.85, the first organic encapsulation layer 163 can be formed of parylene with a refractive index of 1.6, the second organic encapsulation layer 181 can be formed of parylene with a refractive index of 1.6, and the third inorganic encapsulation layer 182 can be formed of silicon oxide with a refractive index of 1.5. Therefore, the absolute value of the refractive index difference between the first inorganic encapsulation layer 161 and the first organic encapsulation layer 163 is 0.25, which is larger than the absolute value of refractive index difference between the second organic encapsulation layer 181 and the third inorganic encapsulation layer 182, which is 0.1.

Figure 5:
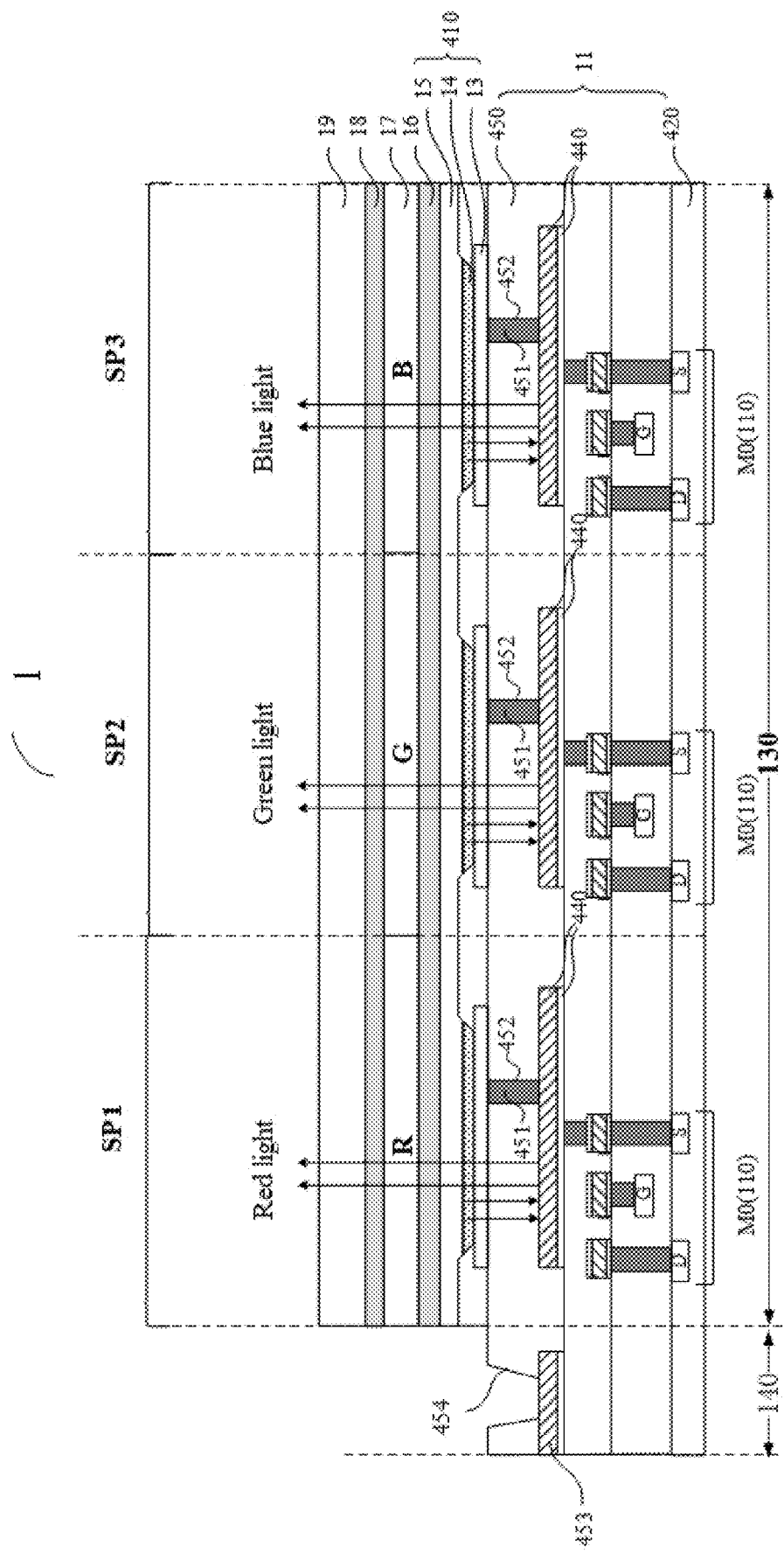
FIG. 5 is a schematic cross-sectional view of a portion of a display device provided by at least one embodiment of the present disclosure.

FIG. 5 is a schematic cross-sectional view of a portion of a display device provided by some embodiments of the present disclosure. Except that the structure of the array substrate 10 is represented in more details and a plurality of sub-pixels are shown, the array substrate of this embodiment is substantially the same as the array substrate 10 in the display device 1 shown in FIG. 1A. It should be understood that the array substrate 10 in this embodiment may be completely or substantially the same as the array substrate 10 as shown in FIG. 1A, and the detailed structure of the array substrate 10 is not shown in FIG. 1A for the sake of concise description. Of course, the array substrate of this embodiment may be different from the array substrate 10 shown in FIG. 1A as long as the corresponding functions can be achieved. It should be understood that the array substrate 10 shown in FIG. 1A also includes a plurality of sub-pixels, and the sub-pixels are not shown in FIG. 1A for the sake of concise description.

In this embodiment, as shown in FIG. 5, the array substrate 10 includes a silicon substrate 11 and a light-emitting device 410 (i.e., a light-emitting element). For example, the silicon substrate 11 includes a silicon-based base substrate 420, a pixel circuit 110, a light reflection layer 440, and an insulating layer 450 that are stacked in sequence. The light-emitting device 410 includes an anode layer 13 (i.e., the first electrode of the light-emitting device), an organic light-emitting layer 14, and a cathode layer 15 (i.e., the second electrode of the light-emitting device) that are stacked in sequence on the insulating layer 450. The anode layer 13 is a transparent electrode layer. For example, the insulating layer 450 is of light transmittance so that the light emitted by the organic light-emitting layer 14 penetrates therethrough and reaches the light reflection layer 440 to be reflected by the light reflection layer 440.

For example, the insulating layer 450 includes via holes 452 filled with metal members 451, and the light reflection layer 440 is electrically connected with the anode layer 13 by means of the metal members 451. In this way, with conductive paths between the light reflection layer 440 and the anode layer 13 formed in the insulating layer 450, it is advantageous to transmit electrical signals provided by the pixel circuit 110 in the silicon substrate 11 to the anode layer 13 through the light reflection layer 440. In this way, it not only facilitates the pixel circuit 110 to control the light-emitting device 410, but also makes the structure of the silicon-based organic light-emitting display panel more compact, which is advantageous to the miniaturization of the device. Further, for example, the metal members 451 are made of metal material, such as tungsten metal, and a via hole filled with tungsten metal is also referred to as a tungsten via (W-via). For example, in the case that the insulating layer 450 having a relatively large thickness, forming tungsten via holes in the insulating layer 450 can guarantee the stability of the conductive paths, and because the mature process of making the tungsten via holes, the surface of the resultant insulating layer 450 has a good flatness, which is advantageous to reduce the contact resistance between the insulating layer 450 and the anode layer 13. It is understood that the tungsten via is not only suitable for electrical connection between the insulating layer 450 and the anode layer 13, but also suitable for electrical connection between the light reflection layer 440 and the pixel circuit 110, and for electrical connection among other wiring layers.

For example, the silicon substrate 11 includes a pixel circuit 110, the pixel circuit 110 and the light reflection layer 440 is electrically connected with each other, and the pixel circuit 110 is used to drive the light-emitting device 410 to emit light. The pixel circuit 110 includes at least a driving transistor M0 and a switching transistor (not shown), and the driving transistor M0 and the light reflection layer 440 is electrically connected to each other. Thus, electrical signals for driving the light-emitting device 410 may be transmitted to the anode layer 13 through the light reflection layer 440, thereby controlling the light-emitting device 410 to emit light. For example, the driving transistor M0 includes a gate electrode G, a source electrode S, and a drain electrode D. The source electrode S of the driving transistor M0 is electrically connected to the light reflection layer 440. When the driving transistor M0 is in the switch-on state and is in the saturation state, under the control of the data voltage applied by the gate, the driving current provided by the power supply line can be transmitted to the anode layer 13 through the source electrode S of the driving transistor M0 and the light reflection layer 440. Because a voltage difference is generated between the anode layer 13 and the cathode layer 15, between which an electric field is formed, holes and electrons are respectively injected into the organic light-emitting layer 14 and recombined, and therefore the organic light-emitting layer 14 emits light under the effect of the electric field. It is understood that positions of the source electrode S and the drain electrode D in the driving transistor M0 can be interchangeable, and therefore, the light reflection layer 440 and one of the source electrode S and the drain electrode D are electrically connected with each other.

For example, the array substrate 10 includes the plurality of sub-pixels (or pixel units), and three sub-pixels are exemplarily shown in FIG. 5, that is, a red sub-pixel SP1, a green sub-pixel SP2, and a blue sub-pixel SP3. Each sub-pixel corresponds to a sub-pixel region of the array substrate 10. That is, each sub-pixel is disposed with an independent light-emitting device 410 and a driving transistor M0.

For example, the insulating layer 450 in the three sub-pixels are formed in one-piece to facilitate fabrication. For example, as shown in FIG. 5, the insulating layer 450 further include an opening 454 for exposing a bonding pad 453, and the arrangement of the opening 454 is advantageous for electrical connection and signal communication between the bonding pad 453 and an external circuit. For example, the opening 454 for exposing the bonding pad 453 is located in a peripheral region 140. The colors of the sub-pixels in the array substrate 10 are only schematic, and may also include other colors such as yellow, white, or the like.

For example, as shown in FIG. 5, the array substrate 10 further includes a second thin film encapsulation layer 16, a color filter layer 17, and a first thin film encapsulation layer 18 that are disposed on the cathode layer 15 in sequence. The display device 1 further includes a cover panel 19 disposed on the first thin film encapsulation layer 18. For example, the second thin film encapsulation layer 16 is located on the side of the cathode layer 15 away from the silicon-based base substrate 420. The color filter layer 17 is located on the side of the second thin film encapsulation layer 16 away from the silicon-based base substrate 420, and includes a red light filtering unit R, a green light filtering unit G, and a blue light filtering unit B. For example, the first thin film encapsulation layer 18 and the cover panel 19 are located on the side of the cathode layer 17 away from the silicon-based base substrate 420. For the specific materials of the first thin film encapsulation layer 18, the color filter layer 17, the second thin film encapsulation layer 16, and the cover panel 19, conventional materials in the art can be used, which will not be described in detail herein.

For example, in the array substrate 10 provided by an embodiment of the present disclosure, the light-emitting device 410 including the anode layer 13, the organic light-emitting layer 14, and the cathode layer 15, and the first thin film encapsulation layer 18, the color filter layer 17, the second thin film encapsulation layer 16 and the cover panel 19 can be fabricated on an individual prepared silicon substrate 11, and in addition, in the same process, the insulating layer 450 above the bonding pad 453 can also be etched to expose the bonding pad 453 and make it be able to bond with a flexible printed circuit board (FPC) or a wire. Therefore, in embodiments of the present disclosure, for example, a silicon substrate 11 including the light reflection layer 440 and the insulating layer 450 and suitable for forming the light-emitting device 430 may be fabricated by a fab, and then structure above the silicon substrate is prepared in a display panel factory, which not only reduces the difficulty of manufacturing the light reflection layer 440, but also benefits the subsequent processes of the panel factory.

Figure 6:
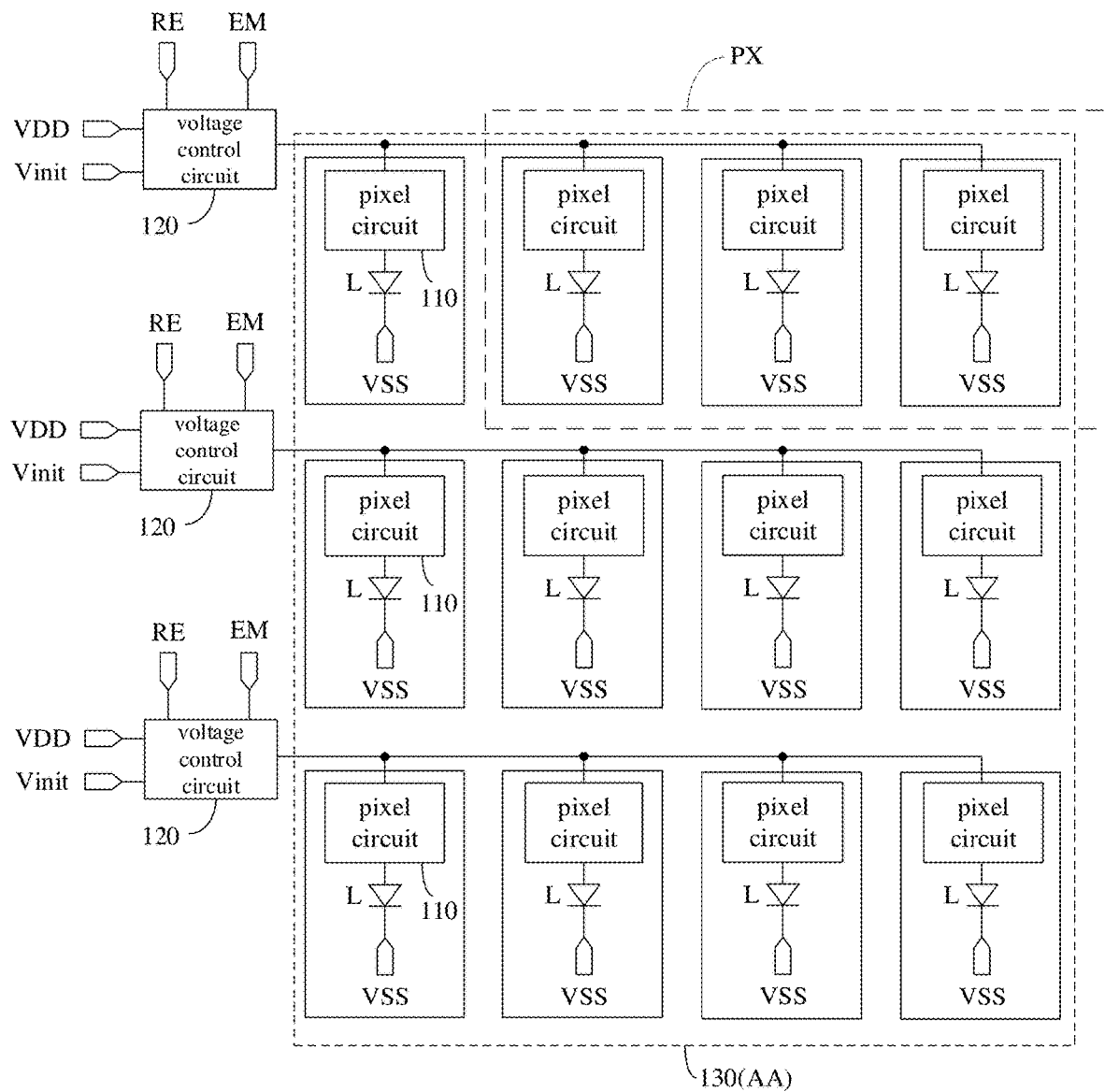
FIG. 6 is a schematic circuit principle illustration of an array substrate provided by at least one embodiment of the present disclosure.

FIG. 6 is a schematic circuit principle illustration of an array substrate provided by some embodiments of the present disclosure. The array substrate includes a plurality of light-emitting devices L located in a display region 130 (AA regions) as shown in FIG. 5 and pixel circuits 110 coupled to each of the light-emitting devices L in a one-to-one correspondence, and the pixel circuits 110 include driving transistors respectively. Moreover, the array substrate may further include a plurality of voltage control circuits 120 located in a non-display region outside the display region 130 of the array substrate. For example, at least two pixel circuits 110 in a row share one voltage control circuit 120, and first electrodes of the driving transistors in a row of pixel circuits 110 are coupled with a voltage control circuit 120 in common, and a second electrode of each driving transistor is coupled with the corresponding light-emitting device L. The voltage control circuit 120 is configured to output an initialization signal Vinit to the first electrodes of the driving transistors and control the corresponding light-emitting devices L to reset, in response to a reset control signal RE, and configured to output a first power signal VDD to the first electrodes of the driving transistors so as to drive the light-emitting devices L to emit light, in response to a light-emitting control signal EM. By sharing the voltage control circuit 120, the structure of each pixel circuit in the display region 130 can be simplified, and the occupied area of the pixel circuits in the display region 130 can be reduced, so that more pixel circuits and more light-emitting devices can be disposed in the display region 130 to achieve the organic light-emitting display panel with a high PPI. In addition, the voltage control circuit 120 outputs the initialization signal Vinit to the first electrodes of the driving transistors and control the corresponding light-emitting devices to reset under the control of the reset control signal RE, so that the influence, by the voltages loaded on the light-emitting devices during the light emission in the previous frame, on light emission in the next frame can be avoided, thereby alleviating a phenomenon of ghost shadow.

For example, the array substrate can further include a plurality of pixel units PX located in the display region 130, each pixel unit PX including a plurality of sub-pixels; each sub-pixel includes a light-emitting device L and a pixel circuit 110, respectively. Further, the pixel unit PX can include three sub-pixels of different colors. The three sub-pixels may be a red sub-pixel, a green sub-pixel, and a blue sub-pixel. Of course, the pixel unit PX may also include 4, 5 or more sub-pixels, which may be designed and determined according to the actual application environment and is not limited herein.

For example, it is possible to make the pixel circuits 110 in at least two adjacent sub-pixels in the same row to share one voltage control circuit 120. For example, in some examples, as shown in FIG. 6, it is possible to make all pixel circuits 110 in the same row to share one voltage control circuit 120. Alternatively, in other examples, it is also possible to make the pixel circuits 110 in at least two, three or more adjacent sub-pixels in the same row to share one voltage control circuit 120, which is not limited herein. In this way, the occupied area of the pixel circuits in the display region 130 can be reduced by sharing of the voltage control circuit 120.

Figure 7:
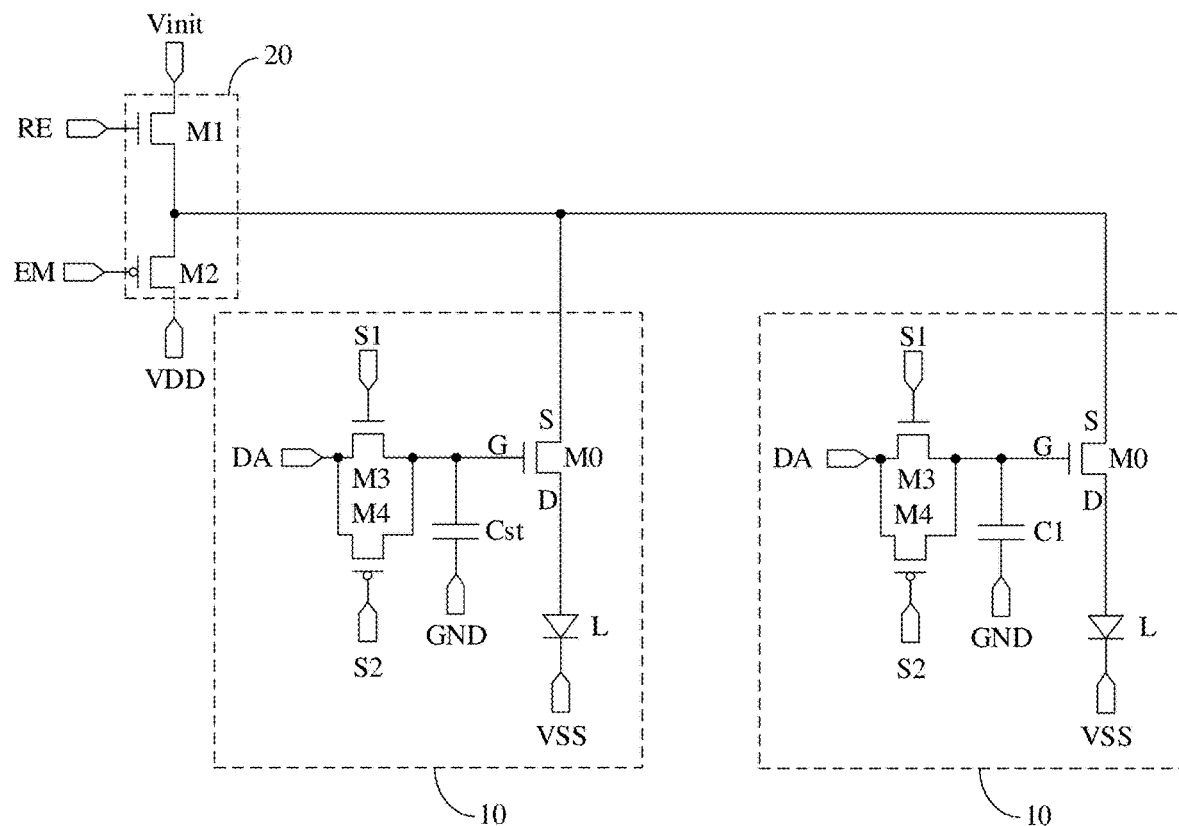
FIG. 7 is a circuit diagram of a specific implementation example of a voltage control circuit and a pixel circuit of an array substrate provided by at least one embodiment of the present disclosure.

FIG. 7 is a circuit diagram of a specific implementation example of a voltage control circuit and a pixel circuit of an array substrate provided by some embodiments of the present disclosure. For example, the driving transistor M0 in the pixel circuit 110 may be an N-type transistor. The light-emitting device L can include an OLED. In this way, a positive electrode of the OLED is electrical connected with a second terminal D of the driving transistor M0, and a negative electrode of the OLED is electrical connected with a second power supply terminal VSS. The voltage of the second power supply terminal VSS generally is a negative voltage or ground voltage VGND (generally 0V), and the voltage of the initialization signal may be set as ground voltage VGND, which is not limited herein. For example, the OLED can be provided as a Micro-OLED or Mini-OLED, which further benefits the realization of a high PPI organic light-emitting display panel.

For example, taking two pixel circuits 110 included in one row as an example, the voltage control circuit 120 can include a first switching transistor M1 and a second switching transistor M2. A gate of the first switching transistor M1 is used to receive the reset control signal RE, a first electrode of the first switching transistor M1 is used to receive the initialization signal Vinit, and a second electrode of the first switching transistor M1 is coupled with the first electrode S of the corresponding driving transistor M0. A gate of the second switching transistor M2 is used to receive the light-emitting control signal EM, a first electrode of the second switching transistor M2 is used to receive the first power supply signal VDD, and a second electrode of the second switching transistor M2 is coupled with the first electrode S of the corresponding driving transistor M0.

For example, it is possible to make the first switching transistor M1 and the second switching transistor M2 to be of different types. For example, the first switching transistor M1 is an N-type transistor, and the second switching transistor M2 is a P-type transistor. Alternatively, the first switching transistor M1 is a P-type transistor, and the second switching transistor M2 is an N-type transistor. Of course, it is also possible to make the first switching transistor M1 and the second switching transistor M2 to be of the same type. In the practical application, it is required that types of the first switching transistor M1 and the second switching transistor M2 are designed according to the practical application environment, which is not limited herein.

For example, the pixel circuit 110 may further include a third switching transistor M3 and a storage capacitor Cst. For example, a gate of the third switching transistor M3 is used to receive the first gate scan signal S1, a first electrode of the third switching transistor M3 is used to receive the data signal DA, and a second electrode of the third switching transistor M3 is coupled with the gate G of the driving transistor M0. A first terminal of the storage capacitor Cst is coupled with the gate G of the driving transistor M0, and a second terminal of the storage capacitor Cst is coupled with the ground terminal GND.

For example, the pixel circuit 110 can further include a fourth switching transistor M4. For example, a gate of the fourth switching transistor M4 is used to receive the second gate scan signal S2, a first electrode of the fourth switching transistor M4 is used to receive the data signal DA, and a second electrode of the fourth switching transistor M4 is coupled with the gate G of the driving transistor M0. The fourth switching transistor M4 and the third switching transistor M3 are of different types. For example, the third switching transistor M3 is an N-type transistor, and the fourth switching transistor M4 is a P-type transistor; or the third switching transistor M3 is a P-type transistor, and the fourth switching transistor M4 is an N-type transistor.

It should be noted that, when the voltage of the data signal DA is a voltage corresponding to a high gray scale, the data signal DA is transmitted to the gate G of the driving transistor M0 by, for example, turning on the P-type fourth switching transistor M4, so it can be avoided that the voltage of the data signal DA is influenced by, for example, the threshold voltage of the N-type third switching transistor M3. When the voltage of the data signal DA is a voltage corresponding to a low gray scale, the data signal DA is transmitted to the gate G of the driving transistor M0 by, for example, turning on the N-type third switching transistor M3, so that it can be avoided that the voltage of the data signal DA is influenced by, for example, the threshold voltage of the P-type fourth switching transistor M4. In this way, the voltage range that is input to the gate G of the driving transistor M0 can be increased.

The driving transistor M0, the first switching transistor M1, the second switching transistor M2, the third switching transistor M3, and the fourth switching transistor M4, which are described above, are MOS transistors prepared in a silicon substrate.

It should be noted that the embodiments of the present disclosure do not provide all the constituent components of the display device for sake of clarity and conciseness. In order to realize the basic functions of the display device, those skilled in the art can provide and dispose other structures not shown according to specific requirement, and embodiments of the present disclosure are not limited thereto.

In the aforementioned at least one embodiment of the present disclosure, the display device can avoid cracking of the first thin film encapsulation layer when the panel is cut, so that the display device can avoid invasion of water and oxygen in the outside atmosphere along cracks of the first thin film encapsulation layer to the OLED device in the display device, enhance the encapsulation technology for blocking the water and oxygen, and prolong the service life of the display device. In some other embodiments, on the basis of the above structure, the display device can implement double effective encapsulation for the light-emitting device 410 by setting the area of the second thin film encapsulation layer 16 smaller than the area of the first thin film encapsulation layer, which achieves effective blocking of water vapor, oxygen or the like for the purpose of protection of the light-emitting device 410 and extension of the service life of the light-emitting device 410. In still other embodiments, on the basis of the above structure, the display device implements sealing between the sides of the periphery of the cover panel and the silicon substrate of the array substrate by sealant 12, so that the third protection is provided for blocking invasion of water and oxygen, and in turn the service life of the silicon-based OLED display device largely increases.

Figure 8:
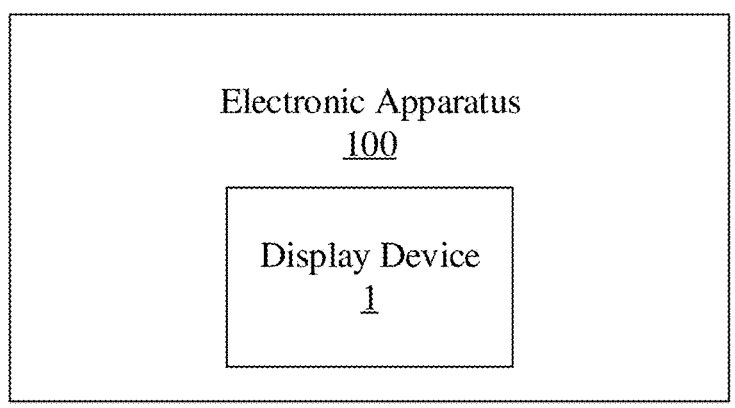
FIG. 8 is a schematic illustration of an electronic apparatus provided by at least one embodiment of the present disclosure.

An electronic apparatus is also provided by at least one embodiment of the present disclosure. FIG. 8 is a schematic illustration of an electronic apparatus provided by at least one embodiment of the present disclosure. As shown in FIG. 8, the electronic apparatus 100 includes the display device 1 provided in any one of embodiments of the present disclosure, for example, the display device 1 shown in FIG. 1A or FIG. 5. For example, the electronic apparatus 100 can be a virtual reality apparatus or an augmented reality apparatus.

For example, the display device 1 can be a silicon-based OLED display device, and embodiments of the present disclosure are not limited thereto.

It should be noted that the embodiments of the present disclosure do not provide all the constituent components of the electronic apparatus 100 for sake of clarity and conciseness. In order to realize the basic functions of the electronic apparatus 100, those skilled in the art can provide and dispose other structures not shown according to specific requirement, and embodiments of the present disclosure are not limited thereto.

For technical effects of the electronic apparatus 100 provided by the above embodiments, reference can be made to the technical effects of the display device provided in the embodiment of the present disclosure, which will not be repeated herein.

Figure 9:
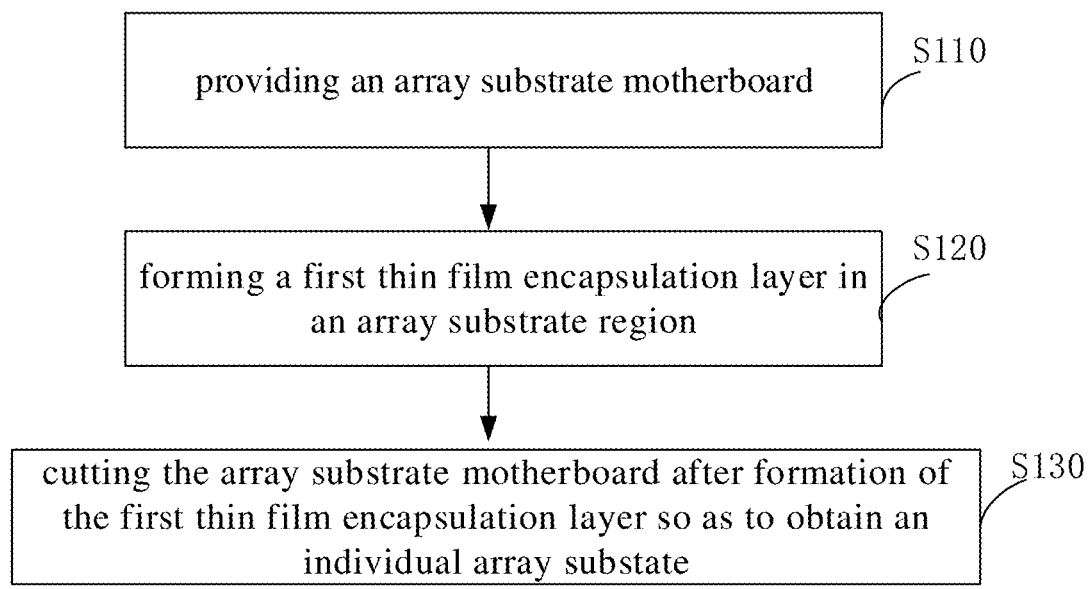
FIG. 9 is a flowchart of a method for manufacturing of a display device provided by at least one embodiment of the present disclosure.

A method for manufacturing of a display device is also provided by at least one embodiment of the present disclosure. FIG. 9 shows a flowchart of a method for manufacturing of a display device provided by at least one embodiment of the present disclosure. For example, the method for manufacturing can be used to manufacturing the display device provided by any one of embodiments of the present disclosure. For example, it can be used to manufacture the display substrate as shown in FIG. 1A. As shown in FIG. 9, the method for manufacturing the display device includes step S110 to step S130.

Step S110: providing an array substrate motherboard.

Step S120: respectively forming a first thin film encapsulation layer in an array substrate region of the array substrate motherboard.

Step S130: cutting the array substrate motherboard after formation of the first thin film encapsulation layer so as to obtain an individual array substrate.

For step S110, for example, the array substrate motherboard is a silicon-based organic light-emitting diode array substrate mother board, and includes at least one array substrate region, for example, a plurality of array substrate regions, and each of the array substrate regions includes a plurality of light-emitting devices arranged in an array. For example, after the motherboard including the plurality of array substrate regions is cut along scribe lines, the plurality of array substrate regions are separated from each other and thus a plurality of the array substrates 10 that are described above can be formed individually.

For step S120, for example, in the array substrate region correspondingly disposed with the first thin film encapsulation layer, at each edge of the first thin film encapsulation layer, an orthographic projection of the array substrate on a plane parallel to the array substrate extends beyond an orthographic projection of the first thin film encapsulation layer on the plane. That is, the relative position relationship between the first thin film encapsulation layer and the array substrate region is the same as the relative position relationship between the first thin film encapsulation layer 18 and the array substrate 10 as shown in FIG. 1A or FIG. 2, and the specific introduction can be referred to the relevant description of FIG. 1A and FIG. 2, and is not repeated herein.

For example, in some examples, among edges of the first thin film encapsulation layer 18 and edges of the array substrate 10, which correspond to each other and have unequal lengths, the distance d of each edge of the first thin film encapsulation layer 18 to a corresponding edge of the array substrate 10 is larger than the sum of deposition alignment accuracy (e.g., about 50 micrometers (μm)) of the first thin film encapsulation layer 18 and cutting alignment accuracy (e.g., about 100 μm) of the array substrate 10 (or scribe lines), so as to avoid that the orthographic projection of the array substrate region in a plane parallel to an array substrate motherboard extends beyond the orthographic projection of the first thin film encapsulation layer on the plane caused by coating alignment error and/or cutting alignment error, thus avoiding cracking of the first thin film encapsulation layer in the course of the cutting.

Figure 4:
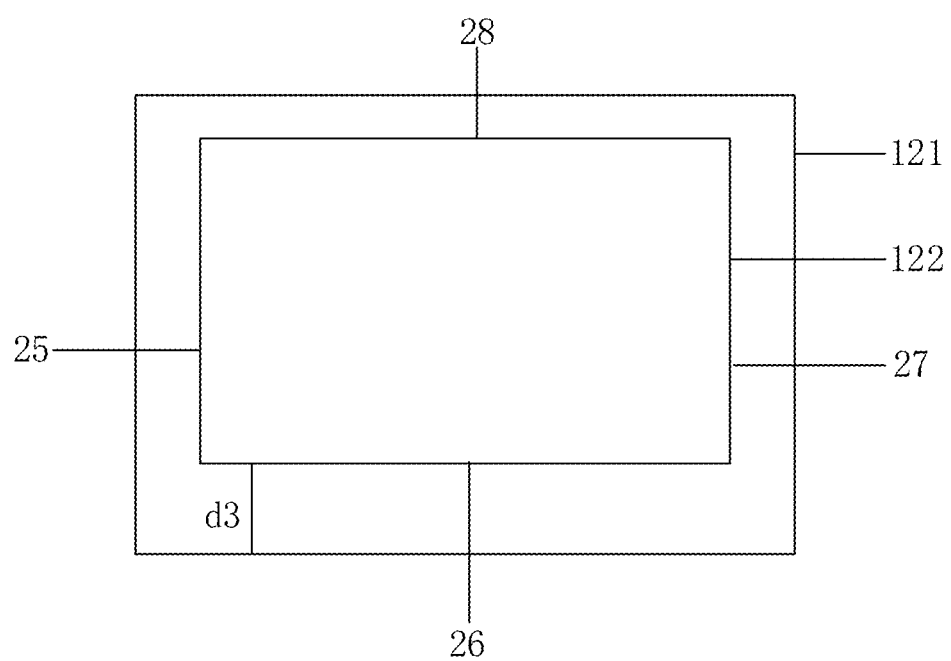
FIG. 4 is a schematic projection diagram of yet another example of the display device shown in FIG. 1A.

For example, in some examples, the method for manufacturing further includes: forming a light-emitting device on the array substrate region; forming a second thin film encapsulation layer between the light-emitting device and the first thin film encapsulation layer; forming a color filter layer between the first thin film encapsulation layer and the second thin film encapsulation layer. For example, at each side of the second thin film encapsulation layer, the orthographic projection of the first thin film encapsulation layer on the plane extends beyond the orthographic projection of the second thin film encapsulation layer in the plane. That is, the relative position relationship between the first thin film encapsulation layer and the second thin film encapsulation layer is the same as the relative position relationship between the first thin film encapsulation layer 18 and the second thin film encapsulation layer 16 shown in FIG. 1A or FIG. 4, and the specific introduction can be referred to the relevant description of FIG. 1A and FIG. 4, and is not repeated herein.

For example, in some examples, among edges of the first thin film encapsulation layer 18 and edges of the second thin film encapsulation layer 16, which correspond to each other and have unequal lengths, the distance of each edge of the first thin film encapsulation layer 18 to a corresponding edge of the second thin film encapsulation layer 16 is larger than the sum of deposition alignment accuracy (e.g., about 50 µm) of the first thin film encapsulation layer 18 and deposition alignment accuracy (e.g., about 50 µm) of the second thin film encapsulation layer 16.

For example, in some examples, as shown in 1A, an edge of the first thin film encapsulation layer 18 close to the light-emitting device 410 is attached to a portion of an edge of the second thin film encapsulation layer 16 away from the light-emitting device 410. For example, the edge of the first thin film encapsulation layer 18 close to the light-emitting device 410 is attached to a side edge of the second thin film encapsulation layer 16 away from the light-emitting device 410 to enhance the sealing effect.

Figure 3:
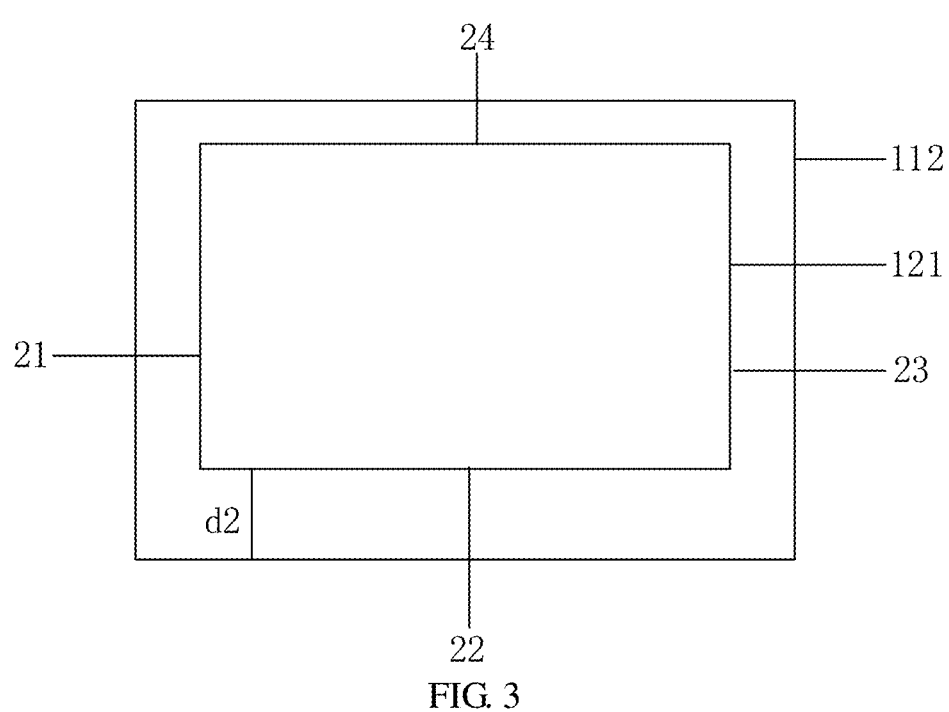
FIG. 3 is a schematic projection diagram of another example of the display device shown in FIG. 1A.

For step S130, for example, before cutting the array substrate motherboard after formation of the first thin film encapsulation layer so as to separate the plurality of array substrate regions from each other, the method for manufacturing further includes forming a cover panel on the first thin film encapsulation layer of the array substrate region, that is, the above cutting operation is performed after the cover panel is formed, thereby obtaining an individual encapsulated array substrate. For example, at each edge of the first thin film encapsulation layer, an orthographic projection of the cover panel on the plane extends beyond the orthographic projection of the first thin film encapsulation layer on the plane. That is, the relative position relationship between the first thin film encapsulation layer and the cover panel is the same as the relative position relationship between the first thin film encapsulation layer 18 and the cover panel 19 shown in FIG. 1A or FIG. 3, and the specific introduction can be referred to the relevant description of FIG. 1A and FIG. 3, and is not repeated herein. For example, in some examples, the orthographic projection of the array substrate on the plane extends beyond the orthographic projection of the cover panel on the plane, so that it can avoid breaking of the cover panel caused in the course of the cutting.

For example, in some examples, a sealant connecting the cover panel with the array substrate is formed on sides of a periphery of the cover panel. The sides of the periphery of the cover panel 19 and the array substrate 10 (e.g., the silicon-based base substrate in the array substrate 10) are sealed with sealant 12 therebetween, for example, an adhesive height of the sealant 12 at the sides of the periphery of the cover panel 19 is larger than ½ of a thickness of the cover panel 19 and less than the thickness of the cover panel (e.g., about 0.5 mm). Because the sides of the periphery of the cover panel 19 and the silicon-based base substrate are sealed with sealant 12, a further protection is provided for blocking invasion of water and oxygen, and in turn the service life of the silicon-based OLED display device largely increases.

For example, in some examples, among edges of the first thin film encapsulation layer 18 and edges of the cover panel 19, which correspond to each other and have unequal lengths, the distance of each edge of the first thin film encapsulation layer 18 to a corresponding edge of the cover panel 19 is larger than the sum of deposition alignment accuracy (e.g., about 50 µm) of the first thin film encapsulation layer 18 and adhesion alignment accuracy (e.g., about 100 µm) of the cover panel 19, so as to avoid that an orthographic projection of the cover panel in the plane does not extend beyond an orthographic projection of the first thin film encapsulation layer on said plane, thus avoiding that sealant cannot function for sealing, thereby providing further protection for invasion of water and oxygen.

For example, in embodiments of the present disclosure, a first thin film encapsulation layer and a second thin film encapsulation layer may be deposited by using processes in the technical field such as a mask plate, and it can implement the process of sealing by the sealant between the sides of the periphery of the cover panel and the silicon substrate using the process in the technical field, which is not repeated herein. Embodiments of the present disclosure are not limited thereto.

When an original array substrate motherboard is cut to form individual array substrates, there is a certain distance spaced between the first thin film encapsulation layer 18 and a scribe line, the tool for cutting only contacts the array substrate 10 (e.g., contacts a region without being covered by the first thin film encapsulation layer at edges of the array substrate 10), rather than contacts the first thin film encapsulation layer 18, and so cracking of edges of the first thin film encapsulation layer 18, caused by that edges of the first thin film encapsulation layer 18 is flushed with edge of the array substrate 10, can be avoided, so the invasion of water and oxygen in the outside atmosphere through the cracks to the OLED device can be avoided, and the service life of the display device is prolonged. In another aspect, double effective encapsulation for the light-emitting device 410 can be implemented by setting the area of the second thin film encapsulation layer 16 smaller than the area of the first thin film encapsulation layer, which achieves effective blocking of water vapor, oxygen or the like for the purpose of protection of the light-emitting device 410 and extension of the service life of the light-emitting device 410. Meanwhile, the sides of the periphery of the cover panel and the silicon substrate of the array substrate are sealed by sealant 12 therebetween, so that the third protection is provided for blocking invasion of water and oxygen, and in turn the service life of the silicon-based OLED display device is largely increased.

It should be noted that in the embodiments of the present disclosure, the flow of the method for manufacturing the display device may include more or fewer operations, and these operations may be performed sequentially or in parallel. Although the flow of the above-described method for manufacturing includes operations occurring in a specific order, it should be clearly understood that the order of the operations is not limited. The above-described method for manufacturing can be performed once or more times according to predetermined conditions.

For technical effects of the method for manufacturing the display device provided by the above embodiments, reference may be made to the technical effects of the display device provided in the embodiments of the present disclosure, which will not be repeated herein.

There are a few points to be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

The above description is only an exemplary embodiment of the present disclosure, but is not intended to limit scope of the present disclosure, and the scope of the present disclosure is determined by the appended claims.

What is claimed is:

1. A display device, comprising:
an array substrate and a first thin film encapsulation layer disposed on the array substrate,
wherein the array substrate is a silicon based organic light-emitting diode array substrate, and the array substrate comprises:
a silicon substrate and a light-emitting device disposed on the silicon substrate;
a second thin film encapsulation layer disposed between the light-emitting device and the first thin film encapsulation layer;
a color filter layer disposed between the first thin film encapsulation layer and the second thin film encapsulation layer,
wherein at each edge of the first thin film encapsulation layer, an orthographic projection of the array substrate on a plane parallel to the array substrate extends beyond an orthographic projection of the first thin film encapsulation layer on the plane;
a cover panel covering the first thin film encapsulation layer; and
a sealant disposed at sides of a periphery of the cover panel and connecting the cover panel with the array substrate,
wherein an adhesive height of the sealant at the sides of the periphery of the cover panel is larger than ½ of a thickness of the cover panel and less than the thickness of the cover panel.

2. The display device of claim 1,
wherein at each edge of the first thin film encapsulation layer, an orthographic projection of the cover panel on the plane extends beyond the orthographic projection of the first thin film encapsulation layer on the plane.

3. The display device of claim 1, wherein each edge of the first thin film encapsulation layer is spaced from the sealant by a predetermined distance.

4. The display device of claim 1, wherein at each edge of the second thin film encapsulation layer, the orthographic projection of the first thin film encapsulation layer on the plane extends beyond an orthographic projection of the second thin film encapsulation layer on the plane.

5. The display device of claim 4, wherein the first thin film encapsulation layer and the second thin film encapsulation layer are in contact with an upper surface of the silicon substrate.

6. The display device of claim 5, wherein an edge of the first thin film encapsulation layer close to the light-emitting device is attached to a portion of an edge of the second thin film encapsulation layer away from the light-emitting device.

7. The display device of claim 1, wherein the light-emitting device emits white light.

8. The display device of claim 1, wherein the color filter layer includes a red-green-blue color filter layer.

9. The display device of claim 1, wherein the second thin film encapsulation layer comprises:
a first inorganic encapsulation layer located at a side of the light-emitting device away from the silicon substrate;
a second inorganic encapsulation layer located at a side of the first inorganic encapsulation layer away from the silicon substrate; and
a first organic encapsulation layer located at a side of the second inorganic encapsulation layer away from the silicon substrate,
wherein the first thin film encapsulation layer comprises:
a second organic encapsulation layer located at a side of the color filter layer away from the silicon substrate; and
a third inorganic encapsulation layer located at the side of the second inorganic encapsulation layer away from the silicon substrate,
wherein the first inorganic encapsulation layer has a refraction index larger than that of the second inorganic encapsulation layer, a refractive index of the second inorganic encapsulation layer, a refractive index of the first organic encapsulation layer and a refractive index of the second organic encapsulation layer are substantially same, and the second organic encapsulation layer has a refractive index larger than that of the third inorganic encapsulation layer.

10. The display device of claim 9, wherein an absolute value of refractive index difference between the first inorganic encapsulation layer and the second inorganic encapsulation layer is larger than an absolute value of refractive index difference between the second organic encapsulation layer and the third inorganic encapsulation layer.

11. The display device of claim 9, wherein
the first inorganic encapsulation layer includes silicon nitride,
the second inorganic encapsulation layer includes aluminum oxide,
both the first organic encapsulation layer and the second organic encapsulation layer include at least one layer of parylene molecules, and
the third inorganic encapsulation layer includes silicon oxide.

12. The display device of claim 9, wherein
a thickness of the first inorganic encapsulation layer in a direction perpendicular to a plane of the silicon substrate is larger than a thickness of the second inorganic encapsulation layer in the direction perpendicular to the plane of the silicon substrate,
a thickness of the first organic encapsulation layer in the direction perpendicular to the plane of the silicon substrate is larger than a thickness of the first inorganic encapsulation layer in the direction perpendicular to the plane of the silicon substrate,
the first organic encapsulation layer has a substantively same thickness as the second organic encapsulation layer in the direction perpendicular to the plane of the silicon substrate,
a thickness of the second organic encapsulation layer in the direction perpendicular to the plane of the silicon substrate is larger than a thickness of the third inorganic encapsulation layer in the direction perpendicular to the plane of the silicon substrate, and
a thickness of the third inorganic encapsulation layer in the direction perpendicular to the plane of the silicon substrate is larger than a thickness of the second inorganic encapsulation layer in the direction perpendicular to the plane of the silicon substrate and less than a thickness of the first inorganic encapsulation layer in the direction perpendicular to the plane of the silicon substrate.

13. An electronic apparatus comprising the display device of claim 1, wherein the electronic apparatus is a virtual reality apparatus or an augmented reality apparatus.

14. A display device, comprising:
an array substrate and a first thin film encapsulation layer disposed on the array substrate,
wherein the array substrate is a silicon based organic light-emitting diode array substrate,
at each edge of the first thin film encapsulation layer, an orthographic projection of the array substrate on a plane parallel to the array substrate extends beyond an orthographic projection of the first thin film encapsulation layer on the plane,
wherein, among edges of the first thin film encapsulation layer and edges of the array substrate corresponding to each other and having unequal lengths, a distance of each edge of the first thin film encapsulation layer to a corresponding edge of the array substrate is larger than a sum of a deposition alignment accuracy of the first thin film encapsulation layer and a cutting alignment accuracy of the array substrate.

15. A method for manufacturing a display device, comprising:
forming an array substrate motherboard, wherein the array substrate motherboard is a silicon based organic light-emitting diode array substrate motherboard, and the array substrate motherboard comprises at least one array substrate region;
forming a first thin film encapsulation layer in the array substrate region, wherein at each edge of the first thin film encapsulation layer, an orthographic projection of the array substrate on a plane parallel to the array substrate extends beyond an orthographic projection of the first thin film encapsulation layer on the plane; and
cutting the array substrate motherboard after formation of the first thin film encapsulation layer so as to obtain an individual array substrate,
wherein, among edges of the first thin film encapsulation layer and edges of the array substrate corresponding to each other and having unequal lengths, a distance of each edge of the first thin film encapsulation layer to a corresponding edge of the array substrate is set to be larger than a sum of a deposition alignment accuracy of the first thin film encapsulation layer and a cutting alignment accuracy of the array substrate.

16. The method for manufacturing of claim 15, before cutting the array substrate motherboard after formation of the first thin film encapsulation layer so as to obtain an individual array substrate, further comprising:
forming a cover panel on the first thin film encapsulation layer of the array substrate region,
wherein at each edge of the first thin film encapsulation layer, an orthographic projection of the cover panel on the plane extends beyond the orthographic projection of the first thin film encapsulation layer on the plane.

17. The method for manufacturing of claim 16, wherein, among edges of the first thin film encapsulation layer and edges of the cover panel, which correspond to each other and have unequal lengths, a distance of each edge of the first thin film encapsulation layer to a corresponding edge of the cover panel is set to be larger than a sum of the deposition alignment accuracy of the first thin film encapsulation layer and an adhesion alignment accuracy of the cover panel.

* * * * *